(12) United States Patent
Cheong

(10) Patent No.: US 7,210,987 B2
(45) Date of Patent: May 1, 2007

(54) WAFER GRINDING METHOD

(75) Inventor: Yew Wee Cheong, Penang (MY)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 10/816,559

(22) Filed: Mar. 30, 2004

(65) Prior Publication Data

US 2005/0221728 A1    Oct. 6, 2005

(51) Int. Cl.
*B24B 1/00*      (2006.01)
*H01L 21/00*    (2006.01)

(52) U.S. Cl. ................. 451/54; 438/462; 438/464
(58) Field of Classification Search ............... 451/54, 451/55, 65–69; 438/460, 464, 462, 465, 438/416

See application file for complete search history.

(56) References Cited

U.S. PATENT DOCUMENTS

| | | | |
|---|---|---|---|
| 5,189,843 A | | 3/1993 | Steere, Jr. |
| 5,302,554 A | * | 4/1994 | Kashiwa et al. ............. 438/464 |
| 5,329,733 A | | 7/1994 | Steere, Jr. |
| 5,389,182 A | * | 2/1995 | Mignardi .................... 156/344 |
| 5,827,111 A | | 10/1998 | Ball |
| 5,827,112 A | | 10/1998 | Ball |
| 6,083,811 A | * | 7/2000 | Riding et al. ................ 438/460 |
| 6,193,586 B1 | | 2/2001 | Park et al. |
| 6,475,068 B1 | | 11/2002 | Jimbo et al. |
| 6,629,876 B1 | | 10/2003 | Park et al. |
| 6,777,310 B2 | * | 8/2004 | Inuzuka ....................... 438/460 |
| 6,861,336 B1 | * | 3/2005 | Hampton .................... 438/460 |

* cited by examiner

*Primary Examiner*—Hadi Shakeri
(74) *Attorney, Agent, or Firm*—Schwabe, Williamson & Wyatt, P.C.

(57) ABSTRACT

Methods for grinding low-K interlayer dielectric (ILD) wafers are described herein. In various embodiments, the method may include cutting and severing a semiconductor wafer into a plurality of portions, the cutting and severing being performed in a manner that allows the portions to remain disposed with each other as if the semiconductor wafer had not been cut, applying a tape to a front side of the as if uncut semiconductor wafer, and grinding a backside of the taped as if uncut semiconductor wafer. In various other embodiments, the method may include attaching an adhesive to a backside of the semiconductor wafer prior to cutting the semiconductor wafer along the streets of the semiconductor wafer with the scribed lines to cut and sever the semiconductor wafer into a plurality of portions, with the portions remaining proximally disposed to each other and held in place by the adhesive as if the semiconductor device had not been cut.

17 Claims, 4 Drawing Sheets

Concave
Figure 1b
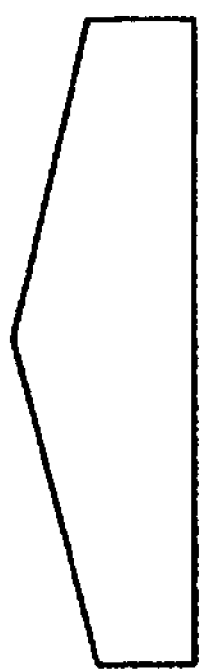
Convex
Figure 1a
Figure 1
(PRIOR ART)

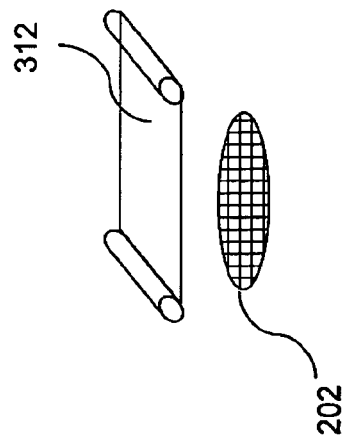
Figure 4c
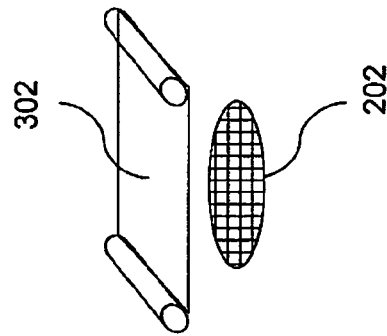
Figure 4b
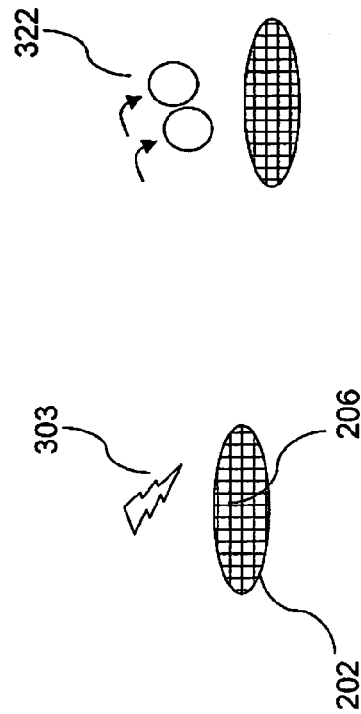
Figure 4a
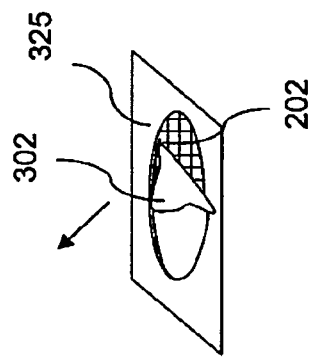
Figure 4f
Figure 4e
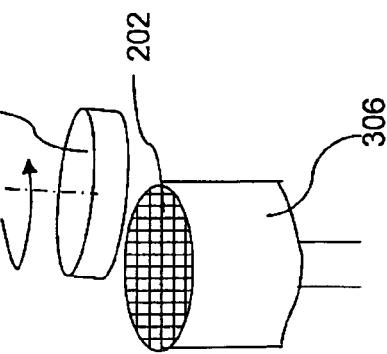
Figure 4d

WAFER GRINDING METHOD

TECHNICAL FIELD & BACKGROUND

The present disclosure is related to the field of semiconductor device manufacturing and packaging. More specifically but not exclusively, the present disclosure is related to grinding of semiconductor wafers having low-K interlayer dielectric (ILD) layers.

The desire for thinner wafers and enhanced performance of integrated circuits has led to the integration of low-K (low-dielectric constant) interlayer dielectrics into semiconductor devices. Low-K dielectrics have lower dielectric constant values than materials such as silicon dioxide (K ~4) and thus are able to reduce the capacitance between metal interconnects on a chip or integrated circuit die, allowing faster and smaller integrated circuits. The use of low-K dielectrics as insulators in semiconductor wafers, however, creates difficulties during wafer packaging assembly operations. For example, grinding of low-K wafers using conventional wafer grinding processes has proven impractical because low-K dielectrics display poor adhesion and fragility. Additionally, wafer sawing may be difficult because cracks often propagate from the dicing saw through the wafer and into the integrated circuit.

BRIEF DESCRIPTION OF THE DRAWINGS

The present invention will be described by way of exemplary embodiments, but not limitations, illustrated in the accompanying drawings in which like references denote similar elements, and in which:

FIGS. 1a and 1b illustrate two profiles of conventional grinding chucks used in semiconductor wafer grinding;

FIGS. 4a–4f illustrate a grinding method for a semiconductor wafer having a low-K ILD layer, in accordance with another embodiment.

DETAILED DESCRIPTION OF ILLUSTRATIVE EMBODIMENTS

Figure 2:
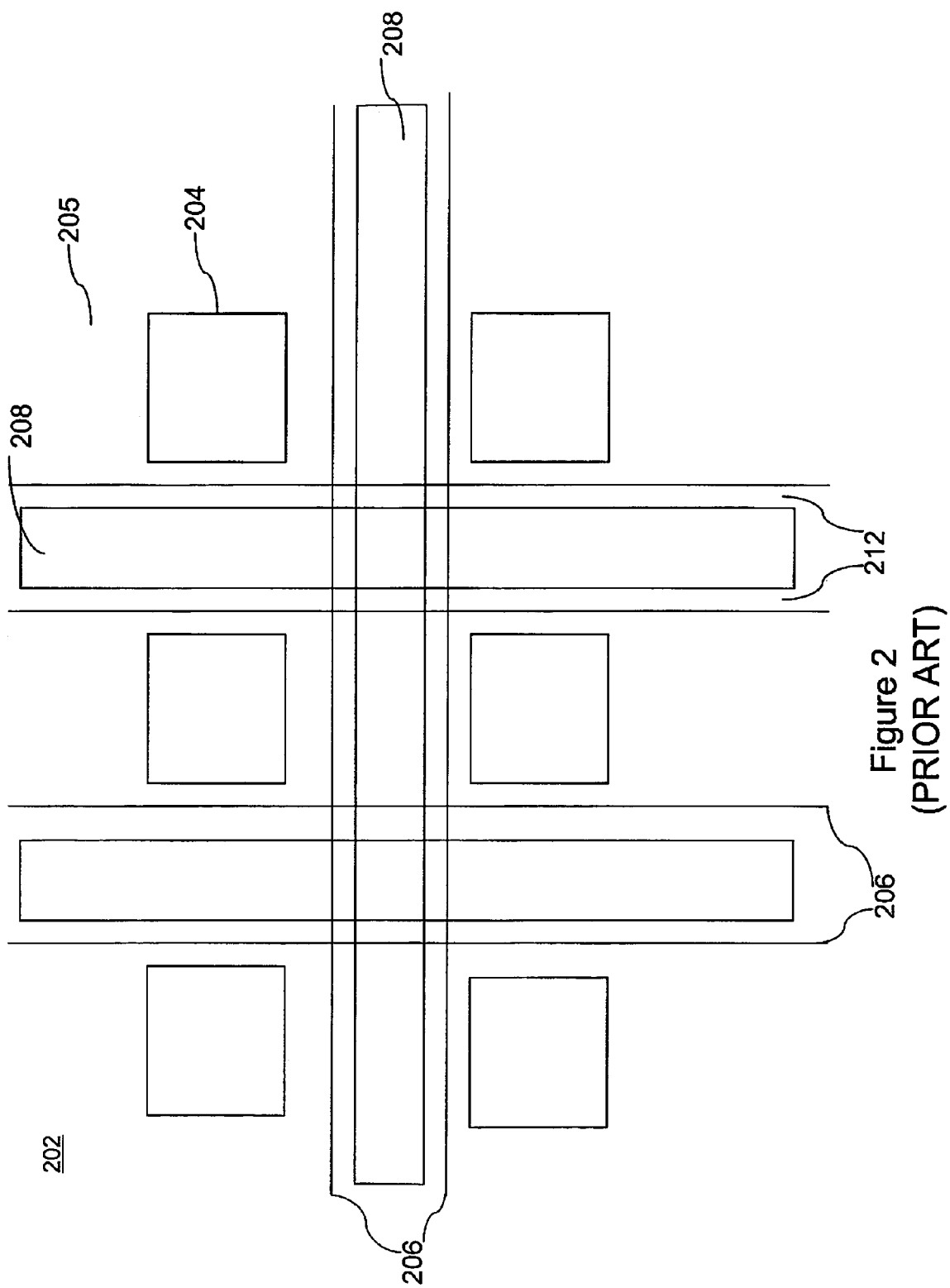
FIG. 2 illustrates a top-down and enlarged partial view of a semiconductor wafer having a low-K interlayer dielectric (ILD) layer.

Embodiments of the present invention include, but are not limited to, methods of low-K interlayer dielectric wafer grinding.

Various aspects of the illustrative embodiments will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative embodiments. However, it will be apparent to one skilled in the art that embodiments of the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Embodiments of a method for grinding a semiconductor wafer having a low-K interlayer dielectric (ILD) layer are discussed below. For simplicity and clarity of explanation, various embodiments of the invention are shown in the figures according to various views. It is to be appreciated that such views are merely illustrative and are not necessarily drawn to scale or to the exact shape. Furthermore, it is to be appreciated that the actual devices utilizing principles of the invention may vary in shape, size, configuration, contour, and the like, other than what is shown in the figures, due to different manufacturing processes, equipment, design tolerances, or other practical considerations that result in variations from one semiconductor device to another.

FIGS. 1a and 1b illustrate two example profiles of conventional grinding chucks used in thinning or grinding a backside (i.e., lower surface or non-active side) of a semiconductor wafer. In grinding, the semiconductor wafer may be held face-down on a vacuum chuck as a series of progressively finer grinding wheels or chucks are moved over the backside of the semiconductor wafer while it is rotated on a turntable. Rather than having a flat grinding surface, such grinding chucks usually have either a convex shape as shown in FIG. 1a or a concave shape as shown in FIG. 1b. Resultantly, grinding stresses and forces may tend to concentrate into highly stressed areas at or near the center of the semiconductor wafer, rather than being distributed evenly across the wafer (as it would, for example, if the grinding chuck were flat). Semiconductor wafers having ILD layers with higher dielectric constants (for example, as discussed previously, silicon dioxide where K~4) are generally able to withstand such grinding stresses, however, wafers including one or more low-K ILD layers (or simply, "low-K ILD wafers") are weaker and grinding may cause cracks to propagate throughout the semiconductor wafer. For these reasons, low-K ILD wafers may not usually be grinded using mechanical grinding processes similar to those described above.

Similarly, low-K ILD wafers may not be singulated using typical sawing processes for semiconductor wafers because of the fragility and poor adhesion of low-K ILD layers. Thus, laser scribing before sawing may often be required to separate or singulate low-K ILD wafers. A prior art method of singulation of low-K ILD wafers uses lasers to scribe through a low-K ILD layer on the wafer to prevent cracks from propagating from a dicing saw through the wafer and into the integrated circuit. To illustrate, FIG. 2 is a top-down and enlarged partial view of a low-K ILD wafer 202. In FIG. 2, a laser may be used to scribe or form two trenches or laser scribe lines 206 along either side of streets separating a plurality of adjacent integrated circuit devices or dice 204 on a front side 205 of wafer 202. The laser may scribe through the low-K ILD layer and stop at the silicon of wafer 202. A saw may then dice or cut along approximately a center of the streets to a width of a saw cut as illustrated by a plurality of saw kerfs 208. In doing so, the saw dices or cuts through both the low-K ILD layer and silicon, to singulate wafer 202 into individual dice or a plurality of dice. Note that cracks created by the saw may be stopped on either side of saw kerf 208 as they reach laser scribe lines 206, as illustrated by reference lines 212.

Figure 3A:
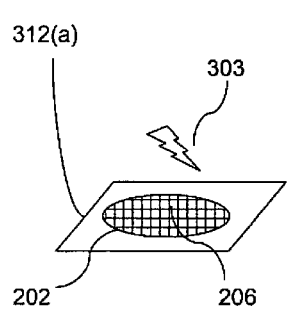
FIGS. 3a–3h illustrate a grinding method for a semiconductor wafer having a low-K ILD layer, in accordance with one embodiment.
Figure 3B:
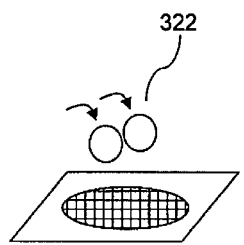

FIGS. 3a–3h illustrate a grinding method for wafer 202 in accordance with one embodiment. In FIG. 3a, for the embodiment, a backside of wafer 202 may be mounted with an adhesive or wafer mounting tape 312(a). In the embodiment, laser 303 forms laser scribe lines 206 along sides of streets on front side of wafer 202 to form trenches in the low-K ILD layer as described in FIG. 2 above. Further, as shown in FIG. 3b, for the embodiment, a saw 322 may then dice or cut wafer 202 along the formed trenches to a width similar to saw kerfs (see FIG. 2, 208) to singulate wafer 202 into a plurality of individual dice. Note that for the embodiment, the dice may be singulated but are retained on mounting tape 312(a).

Note that in various embodiments, other laser scribing and sawing methods may be used to partially dice or dice wafer 202. For example, although not pictured, laser 303 may form trenches in the low-K ILD layer along streets of wafer 202 that may be wider than the saw kerfs in another embodiment.

Figure 3C:
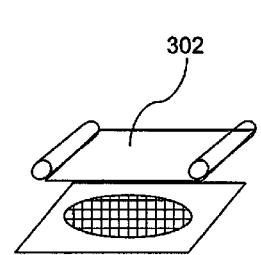

Next and as shown in FIG. 3c, a backgrind tape or grinding protection tape 302 may be attached to wafer 202 to protect dice on front side during grinding in the embodiment. In various embodiments, grinding protection tape 302 may be any type of protective layer or protective coating to protect front side 205 of wafer 202 during grinding.

Figure 3D:
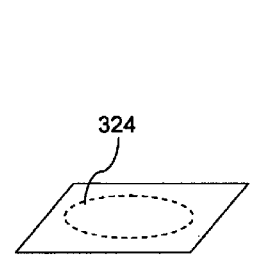
Figure 3E:
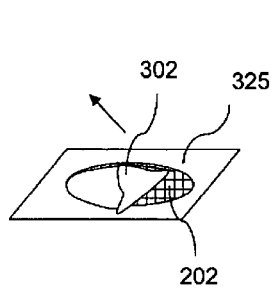
Figure 3F:
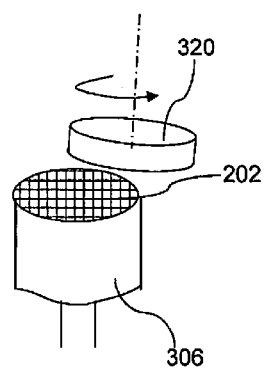

Next and as shown in FIG. 3d, grinding protection tape 302 and mounting tape 312(a) may be cut to define a perimeter 324 of wafer 202 or approximate a shape of wafer 202. Further and as shown in FIG. 3e, for the embodiment, mounting tape 312(a) may be removed from backside of wafer 202 to prepare for grinding. FIG. 3f illustrates that wafer 202 may then be mounted face-down on a vacuum chuck 306 so that grinding chuck 320 may grind wafer 202 to a desired wafer thickness. Note that in the embodiment, cracks created in a low-K ILD layer of wafer 202 during grinding or sawing may not propagate because wafer 202 has already been singulated into individual dice.

Figure 3G:
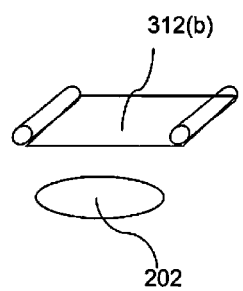
Figure 3H:
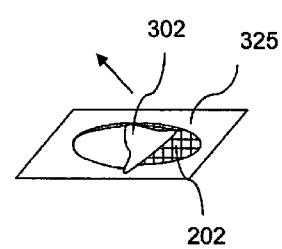

Finally, in the embodiment, backside 309 of thinned and singulated wafer 202 may be mounted with mounting tape 312(b) onto a wafer frame 325, as shown in FIG. 3g. In the embodiment and as shown in FIG. 3h, grinding protection tape 302 may then be removed or de-taped from wafer 202.

FIGS. 4a–4f illustrate a simplified embodiment of the grinding method of wafer 202 illustrated in FIGS. 3a–3h. Note that for the embodiment of FIGS. 4a–4f, wafer 202 need not be mounted prior to laser scribing. For example, in one embodiment, wafer 202 may be held on a vacuum chuck during laser scribing (not shown). Thus, mounting tape 312(a) need not be later removed from wafer 202 nor cut to define a perimeter 324 of wafer 202 as described in FIGS. 3a–3h. In FIG. 4a, laser 303 may form laser scribe lines 206 along either side of streets on front side of wafer 202 to form trenches in the low-K ILD layer in the embodiment. As shown in FIG. 4b, wafer 202 may then be singulated by a saw 322 into a plurality of individual dice. Note that in another embodiment, wafer 202 may be diced to a thickness deeper than a final desired wafer thickness but not completely through the wafer. Next and as shown in FIG. 4c, for the embodiment, grinding protection tape 302 may be attached to front side to protect front side of wafer 202 during grinding.

For the embodiment and as shown in FIG. 4d, wafer 202 may then be mounted face-down on vacuum chuck 306 to be grinded by grinding chuck 320 to a desired wafer thickness. Note that in the embodiment, cracks created in a low-K ILD layer of wafer 202 during grinding may not propagate because stresses may be distributed more evenly across wafer 202 as wafer 202 has already been singulated into separate dice.

Finally, for the embodiment and as shown in FIG. 4e, backside 309 of grinded and singulated wafer 202 may be mounted with mounting tape 312. In the embodiment and as shown in FIG. 4f, wafer 202 may be mounted onto a wafer frame 325. Grinding protection tape 302 may then be removed or de-taped from front side of wafer 202.

Thus, it can be seen from the above descriptions, one or more novel methods for low-K ILD wafer grinding have been described. While the present invention has been described in terms of the foregoing embodiments, those skilled in the art will recognize that the invention is not limited to the embodiments described. Embodiments of the present invention can be practiced with modification and alteration within the spirit and scope of the appended claims.

Thus, the description is to be regarded as illustrative instead of restrictive on the present invention.

What is claimed is:

1. A method comprising:
attaching an adhesive to a back side of a semiconductor wafer;
scribing lines along streets on a front side of the semiconductor wafer;
cutting and severing the semiconductor wafer along the streets into a plurality of portions, the cutting and severing being performed in a manner that allows the portions to remain proximally disposed with each other within an area having a shape and size substantially that of the semiconductor wafer prior to the cutting and severing;
applying a tape from the front side of the semiconductor wafer to tape the portions together to form a taped-together semiconductor wafer;
cutting the tape and the adhesive attached to the back side of the taped-together semiconductor wafer to substantially define a perimeter of the taped-together semiconductor wafer;
removing the adhesive from the back side of the taped-together semiconductor wafer; and
grinding the back side of the taped-together semiconductor wafer.

2. The method of claim 1, further comprising:
mounting the taped-together semiconductor wafer having its back side grinded; and
detaping the tape from the front side of the taped-together semiconductor wafer.

3. A method of thinning a semiconductor wafer, the method comprising:
attaching an adhesive to a back side of the semiconductor wafer;
scribing lines along streets separating integrated circuit devices along a front side of the semiconductor wafer;
cutting the semiconductor wafer along the streets of the semiconductor wafer with the scribed lines to cut and sever the semiconductor wafer into a plurality of portions, with the portions remaining proximally disposed to each other and held in place by the adhesive within an area having a shape and size substantially that of the semiconductor wafer prior to the cutting and severing;
applying a protective layer onto at least a portion of the front side of the adhesively held-together semiconductor wafer;

cutting the protective layer and the adhesive attached to the backside of the adhesively held-together semiconductor wafer to define a perimeter of the adhesively held-together semiconductor wafer; and grinding the backside of the adhesively-held together semiconductor wafer to reduce a thickness of the adhesively-held together semiconductor wafer.

4. The method of claim 3 wherein the semiconductor wafer includes an interlayer dielectric (ILD) layer having a low dielectric constant (K).

5. The method of claim 4 wherein said scribing of lines along the streets includes laser scribing through the ILD layer having a low dielectric constant (K).

6. The method of claim 3 wherein said scribing of lines along the streets includes scribing two lines substantially along either side of each street.

7. The method of claim 3 wherein said applying of the protective layer includes applying a protective coating.

8. The method of claim 3, further comprising removing the protective layer.

9. The method of claim 3 further comprising, removing the adhesive cut to define the perimeter of the semiconductor wafer.

10. The method of claim 3, wherein the protective layer includes a backgrind tape.

11. The method of claim 3, further comprising:

mounting the adhesively held-together semiconductor wafer having its back side grinded; and removing the protective layer from the front side of the adhesively-held together semiconductor wafer.

12. A method, comprising:

mounting with an adhesive a semiconductor wafer, the semiconductor having a first and a second opposite side;

dicing the mounted semiconductor wafer into a plurality of dice, the dicing being performed in a manner that allows the dice to remain proximally disposed to each other within an area having a shape and size substantially that of the semiconductor wafer prior to the dicing;

taping together with a tape the dice, from the first side, to form a taped-together semiconductor wafer;

cutting the tape applied to form the taped-together semiconductor wafer;

cutting the adhesive to approximate the shape of the taped-together semiconductor wafer;

removing the adhesive; and grinding the second side of the taped-together semiconductor wafer.

13. The method of claim 12 wherein the semiconductor device includes a low-K interlayer dielectric (ILD) layer, and said dicing of the semiconductor wafer includes:

laser scribing through the low-K ILD layer to form trenches in the low-K ILD layer; and sawing the semiconductor wafer along the formed trenches to singulate semiconductor devices of the semiconductor wafer.

14. The method of claim 13, wherein said laser scribing through the low-K ILD layer includes scribing two lines along streets separating adjacent ones of the semiconductor devices.

15. The method of claim 12, wherein the adhesive is a mounting tape.

16. The method of claim 12, further comprising mounting the taped-together semiconductor wafer having its second side grinded onto a wafer frame.

17. The method of claim 16, further comprising removing a tape applied from the first side to form the taped-together semiconductor wafer.

* * * * *